United States Patent
Li et al.

(10) Patent No.: US 10,592,045 B2
(45) Date of Patent: Mar. 17, 2020

(54) TOUCH DISPLAY UNIT, TOUCH DISPLAY PANEL AND METHOD FOR DRIVING THEREOF

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Yan Li, Beijing (CN); Xiaobo Xie, Beijing (CN); Lingyun Shi, Beijing (CN); Wei Sun, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 8 days.

(21) Appl. No.: 15/777,454

(22) PCT Filed: Nov. 7, 2017

(86) PCT No.: PCT/CN2017/109723
§ 371 (c)(1),
(2) Date: May 18, 2018

(87) PCT Pub. No.: WO2018/176840
PCT Pub. Date: Oct. 4, 2018

(65) Prior Publication Data
US 2019/0278455 A1    Sep. 12, 2019

(30) Foreign Application Priority Data
Mar. 31, 2017 (CN) .......................... 2017 1 0209383

(51) Int. Cl.
*G06F 3/041* (2006.01)
*G09G 3/36* (2006.01)
(Continued)

(52) U.S. Cl.
CPC ........ *G06F 3/04166* (2019.05); *G02F 1/1333* (2013.01); *G06F 3/041* (2013.01);
(Continued)

(58) Field of Classification Search
CPC . G06F 3/04166; G06F 3/0412; G06K 9/0002; G09G 3/3225; G09G 3/3648;
(Continued)

(56) References Cited

U.S. PATENT DOCUMENTS

2011/0102359 A1* 5/2011 Chiba ................. G02F 1/13338
345/173
2012/0113027 A1    5/2012 Song
(Continued)

FOREIGN PATENT DOCUMENTS

CN        101320185 A    12/2008
CN        103150073 A    6/2013
(Continued)

OTHER PUBLICATIONS

Search Report and Written Opinion dated Jan. 25, 2018 from State Intellectual Property Office of the P.R. China.

*Primary Examiner* — Stephen G Sherman
(74) *Attorney, Agent, or Firm* — Dilworth & Barrese, LLP.; Michael J. Musella, Esq.

(57) ABSTRACT

A touch display unit, a touch display panel and a method for driving the same are disclosed. The touch display unit includes: a first electrode and a second electrode; a touch electrode, which is disposed in a same layer as one of the first electrode and the second electrode and insulated from each other; and a signal line, which is configured to transmit (Continued)

a signal to the touch electrode. In the above touch display unit, a touch signal can be transmitted to the touch electrode through a dedicated signal line, therefore, the synchronous transmission of the display signal and the touch signal is realized.

17 Claims, 7 Drawing Sheets

(51) Int. Cl.
*G06K 9/00* (2006.01)
*G09G 3/3225* (2016.01)
*G02F 1/1333* (2006.01)
*H01L 27/32* (2006.01)

(52) U.S. Cl.
CPC ......... *G06F 3/0412* (2013.01); *G06K 9/0002* (2013.01); *G09G 3/3225* (2013.01); *G09G 3/3648* (2013.01); *H01L 27/32* (2013.01); G02F 1/13338 (2013.01); G02F 2201/121 (2013.01); G02F 2201/123 (2013.01); H01L 27/323 (2013.01); H01L 27/3234 (2013.01); H01L 27/3276 (2013.01)

(58) Field of Classification Search
CPC ........... G02F 1/13338; G02F 2201/121; G02F 2201/123; H01L 27/323; H01L 27/3234; H01L 27/3276

See application file for complete search history.

(56) References Cited

U.S. PATENT DOCUMENTS

| | | | |
|---|---|---|---|
| 2015/0116218 A1* | 4/2015 | Yang | G06F 21/31 345/158 |
| 2015/0205440 A1 | 7/2015 | Yang et al. | |
| 2016/0018938 A1* | 1/2016 | Ding | G06F 3/0416 345/173 |
| 2016/0103547 A1 | 4/2016 | Lu et al. | |
| 2016/0154515 A1 | 6/2016 | Mu et al. | |
| 2016/0187694 A1* | 6/2016 | Kim | G06F 3/0412 349/12 |
| 2016/0291722 A1* | 10/2016 | Du | G06F 3/044 |
| 2016/0370904 A1 | 12/2016 | Wang et al. | |

FOREIGN PATENT DOCUMENTS

| | | |
|---|---|---|
| CN | 103218076 A | 7/2013 |
| CN | 104330935 A | 2/2015 |
| CN | 104536197 A | 4/2015 |
| KR | 1020160093442 A | 8/2016 |

* cited by examiner

TOUCH DISPLAY UNIT, TOUCH DISPLAY PANEL AND METHOD FOR DRIVING THEREOF

CROSS-REFERENCE OF RELATED APPLICATION

The present application claims the priority of Chinese patent application No. 201710209383.7 filed on Mar. 31, 2017, the disclosure of which is hereby incorporated by reference herein in its entirety.

TECHNICAL FIELD

Embodiments of the present disclosure relate to a field of display technology, especially relate to a touch display unit, a touch display panel and a method for driving the touch display panel.

BACKGROUND

In a pixel unit of a conventional touch display panel, a common electrode serves as a touch electrode, therefore, the common electrode is divided into a plurality of sections in a same plane; since the common electrode is closely related to the display, and thus the display and the touch cannot be performed at the same time. For example, the touch detection is performed in a first time period and the display is performed in a second time period. Since the touch detection and display cannot be performed at the same time, not only the charging time is reduced, but also the display effect is affected.

SUMMARY

Embodiments of the present disclosure provide a touch display unit, a touch display substrate, a touch display panel and a method for driving the same, thus synchronous scanning of touch detection and display is realized.

In first aspect of the present disclosure, there is provided a touch display unit, comprising: a first electrode and a second electrode; a touch electrode, disposed in a same layer as one of the first electrode and the second electrode and insulated from each other; and a signal line, configured to transmit a signal to the touch electrode.

For example, in at least one of the embodiments, the touch display unit further comprises a thin film transistor, through which the signal is transmitted from the signal line to the touch electrode.

In second aspect of the present disclosure, there is provided a touch display panel, comprising: a plurality of gate lines and a plurality of data lines, intersected each other to define a plurality of pixel units; a first electrode and a second electrode, both disposed in each pixel unit; a touch electrode, located in at least one of the plurality of pixel units, disposed in a same layer as one of the first electrode and the second electrode and insulated from each other; a signal line, configured to transmit a signal to the touch electrode.

For example, in at least one of the embodiments, the touch display panel further comprises a first thin film transistor, through which the signal is transmitted from the signal line to the touch electrode.

For example, in at least one of the embodiments, the touch display panel further comprises a first gate line, wherein the first gate line is connected with the first thin film transistor.

For example, in at least one of the embodiments, the first thin film transistor comprises a first gate electrode, a first source electrode and a first drain electrode, the first gate electrode is connected with the first gate line, the first source electrode is connected with the signal line, and the first drain electrode is connected with the touch electrode.

For example, in at least one of the embodiments, the touch electrode is disposed in a same layer as the first electrode, and a gap is formed between the touch electrode and the first electrode.

For example, in at least one of the embodiments, the touch display panel further comprises a second thin film transistor disposed in at least one of the plurality of pixel units, wherein the second thin film transistor comprises a second gate electrode, a second source electrode and a second drain electrode, the second source electrode is connected with the touch electrode, and the second drain electrode is connected with the first electrode.

For example, in at least one of the embodiments, the touch display panel further comprises a second gate line, wherein the second gate line is connected with the second gate electrode, the second gate line is substantially parallel to each gate line, and is disposed in the gap between the touch electrode and the first electrode.

For example, in at least one of the embodiments, the touch display panel further comprises a base substrate, wherein an area of an orthographical projection of the touch electrode on a plane of the base substrate is smaller than an area of an orthographical projection of the first electrode on the plane of the base substrate.

For example, in at least one of the embodiments, the touch display panel further comprises a base substrate, wherein the touch electrode and the second electrode are disposed in a same layer, and orthographic projections of the first electrode and the touch electrode on a plane of the base substrate are overlapped with each other.

For example, in at least one of the embodiments, the touch display panel further comprises a base substrate, wherein the signal line is substantially parallel to each data line, the signal line and the data line are disposed in different layers, and orthographic projections of the signal line and the data line on a plane of the base substrate are overlapped with each other.

For example, in at least one of the embodiments, the touch display panel further comprises a base substrate, wherein, the first gate line is substantially parallel to each gate line, the first gate line and the gate line are disposed in different layers, and orthographic projections of the first gate line and the gate line on a plane of the base substrate are overlapped.

In third aspect of the present disclosure, there is provided a method for driving the above-stated touch display pane, the method comprising: transmitting a touch signal to a touch electrode at same time of transmitting a display signal to a first electrode, wherein signals transmitted to the touch electrode and the first electrode are respectively transmitted through different lines.

For example, in at least one of the embodiments, the touch signal is transmitted to the touch electrode through a signal line, and the display signal is transmitted to the first electrode through a data line.

For example, in at least one of the embodiments, after completion of transmitting the touch signal to the touch electrode, the method further comprises: adjusting the touch signal to be the display signal.

For example, in at least one of the embodiments, after completion of transmitting the touch signal to the touch electrode, the method further comprises: adjusting a voltage of the touch signal to be greater than or equal to a voltage of the display signal.

For example, in at least one of the embodiments, the method further comprises: electrically connecting the first electrode and the touch electrode at same time of adjusting the voltage of the touch signal to be greater than or equal to the voltage of the display signal.

For example, in at least one of the embodiments, the transmitting the touch signal to the touch electrode comprises: inputting a touch driving signal for fingerprint recognition to the touch electrode through the signal line.

For example, in at least one of the embodiments, after inputting the touch driving signal to the touch electrode, the method further comprises: outputting a touch sensing signal from the touch electrode through the signal line.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

Figure 1:
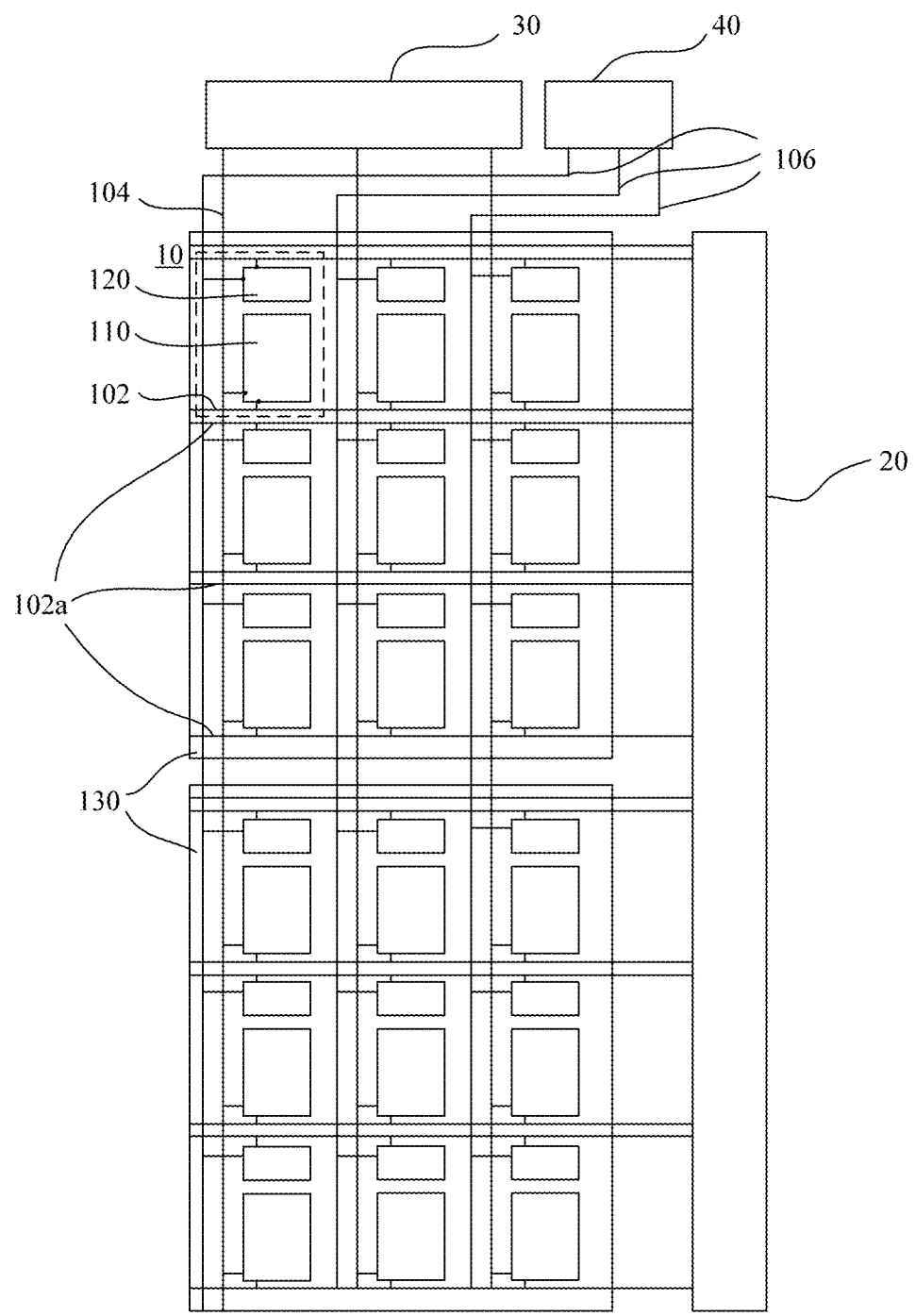
FIG. 1 schematically illustrates a plan view of a touch display panel according to an embodiment of the present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present disclosure, are not intended to indicate any sequence, amount or importance, but distinguish various components. The terms "comprises," "comprising," "includes," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

According to an embodiment of the present disclosure, there is provided a touch display unit, which comprises: a first electrode and a second electrode; a touch electrode disposed in a same layer as one of the first electrode and the second electrode and insulated from each other; and a signal line configured to transmit signals to the touch electrode.

Due to a separate touch electrode disposed in the touch display unit of the embodiment, a touch signal (comprising a touch driving signal and a touch sensing signal) can be transmitted to the touch electrode through a dedicated signal line for touch sensing or fingerprint recognition without affecting the normal display of the first electrode. Therefore, the synchronous transmission of the display signal and the touch signal is realized, not only the charging time is prolonged, but also the reliability of the touch display screen with high resolution and high frequency is increased.

In at least some of the embodiments, the touch display unit further comprises: a thin film transistor, through which the signal is transmitted from the signal line to the touch electrode.

The touch electrode may be disposed on any layer of the touch display unit. For example, the touch electrode is disposed in the same layer as the first electrode and insulated from each other, or disposed in the same layer as the second electrode and insulated from each other. In an embodiment of the present disclosure, the touch electrode is disposed in the same layer as one of the first electrode and the second electrode and insulated from each other, which is advantageous for simplifying the manufacturing process of the touch electrode.

The touch display unit provided in the embodiments of the present disclosure may be applied to an organic electroluminescent display device (OLED) or a thin film transistor liquid crystal display (TFT-LCD). The TFT-LCDs comprise, but not limited to, a twisted nematic (TN-LCD), a vertical orientation (VA-LCD), an in-plane switching (IPS-LCD), a fringe field switching (FFS-LCD), an advanced super-dimension field transition (ADS-LCD), etc.

For example, when the touch display unit is applied to the OLED, one of an anode and a cathode in an OLED serves as the first electrode, and the other one serves as the second electrode. In this case, the touch electrode may be disposed in the same layer as the anode, or may also be disposed in the same layer as the cathode. For example, when the touch display unit is applied to the LCD, the pixel electrode serves as the first electrode, and the common electrode serves as the second electrode. For example, when the touch display unit is applied to the IPS-LCD, the touch electrode, the pixel electrode and the common electrode are disposed in the same layer, and they are insulated from one another. For another example, when the touch display unit is applied to the ADS-LCD, the pixel electrode and the common electrode are disposed in different layers, so the touch electrode may be disposed in the same layer as the pixel electrode, or may also be disposed in the same layer as the common electrode. Hereinafter, the embodiment will be described by taking an example that the pixel electrode is the first electrode and the common electrode is the second electrode.

For example, the TFT-LCD typically comprises an upper substrate and a lower substrate disposed opposite to each other, and a liquid crystal layer disposed between the two substrates. The common electrode and the pixel electrode may be respectively disposed on the upper and lower substrate, or may also be disposed together on one of the substrates. For example, the upper substrate is a color filter substrate, and the lower substrate is a TFT array substrate.

According to another embodiment of the present disclosure, there is provided a touch display substrate, which comprises: at least one of a pixel electrode disposed in each pixel unit and a common electrode; a touch electrode disposed in at least one of pixel units, the touch electrode is disposed in the same layer as one of the pixel electrode and the common electrode and insulated from each other; and a signal line configured to transmit a signal to the touch electrode.

In at least some of the embodiments, the touch display substrate further comprises: a thin film transistor, through which the signal is transmitted from the signal line to the touch electrode.

Due to a separate touch electrode disposed in the touch display unit of the embodiment, a touch signal (comprising a touch driving signal and a touch sensing signal) can be transmitted to the touch electrode through a dedicated signal line for touch sensing or fingerprint recognition without affecting the normal display of the first electrode. Therefore, the synchronous transmission of the display signal and the touch signal is realized, not only the charging time is prolonged, but also the reliability of the touch display screen with high resolution and high frequency is increased.

According to still another embodiment of the present disclosure, there is provided a touch display panel, which comprises: a plurality of gate lines and a plurality of data lines intersected each other to define a plurality of pixel units; a common electrode and a pixel electrode disposed in each pixel unit. The touch display panel further comprises: a touch electrode disposed in at least one of pixel units, which is disposed in the same layer as one of the pixel electrode and the common electrode and is insulated from each other. The touch display panel further comprises: a signal line configured to transmit a signal to the touch electrode.

Compared with the existing touch display panel, due to a separate touch electrode disposed in the touch display unit of the embodiment, a touch signal (comprising a touch driving signal and a touch sensing signal) can be transmitted to the touch electrode by a dedicated signal line for touch sensing or fingerprint recognition without affecting the normal display of the first electrode. Therefore, the synchronous transmission of the display signal and the touch signal is realized, not only the charging time is prolonged, but also the reliability of the touch display screen with high resolution and high frequency is increased.

In the existing touch display panel, since the common electrode serves as the touch electrode, the voltage inconsistency of each common electrode is easily caused. Moreover, since the touch signal is not inverted with the positive and negative values centered on the voltage of the common electrode, the problems such as flick and drift caused by the residue of DC voltage are generated. However, in the embodiment of the present disclosure, since the common electrode doesn't serve as the touch electorde, not only the voltage inconsistency of the common electrode can be overcome, but also the problems such as flick and drift can be avoided.

In at least some of the embodiments, the touch electrode is disposed in at least one of pixel units. For example, a part of a plurality of pixel units is provided with the touch electrode. The parts of pixel units may be pixel units which are spaced apart from one another by at least one row or at least one column, or may be pixel units located on the same row or the same column and spaced apart from one another by at least one pixel unit. Herein, "at least one" includes but not limited to one, two, or three, etc. In at least some of the embodiments, the touch electrode is disposed in each pixel unit, in order to increase the touch accuracy. It can be understood that, the number and the distribution of the touch electrodes described in embodiments of the present disclosure are only illustrative; those skilled in the art can select suitable numbers and distributions of the touch electrodes depending on the factors such as touch accuracy and manufacturing process, and those skilled in the art can adjust the numbers and distributions of the signal lines connected with the touch electrodes; for example, one signal line serves for one touch electrode, or one signal line serves for one row or one column of pixel units, which should be within the scope of the present disclosure.

Figure 2:
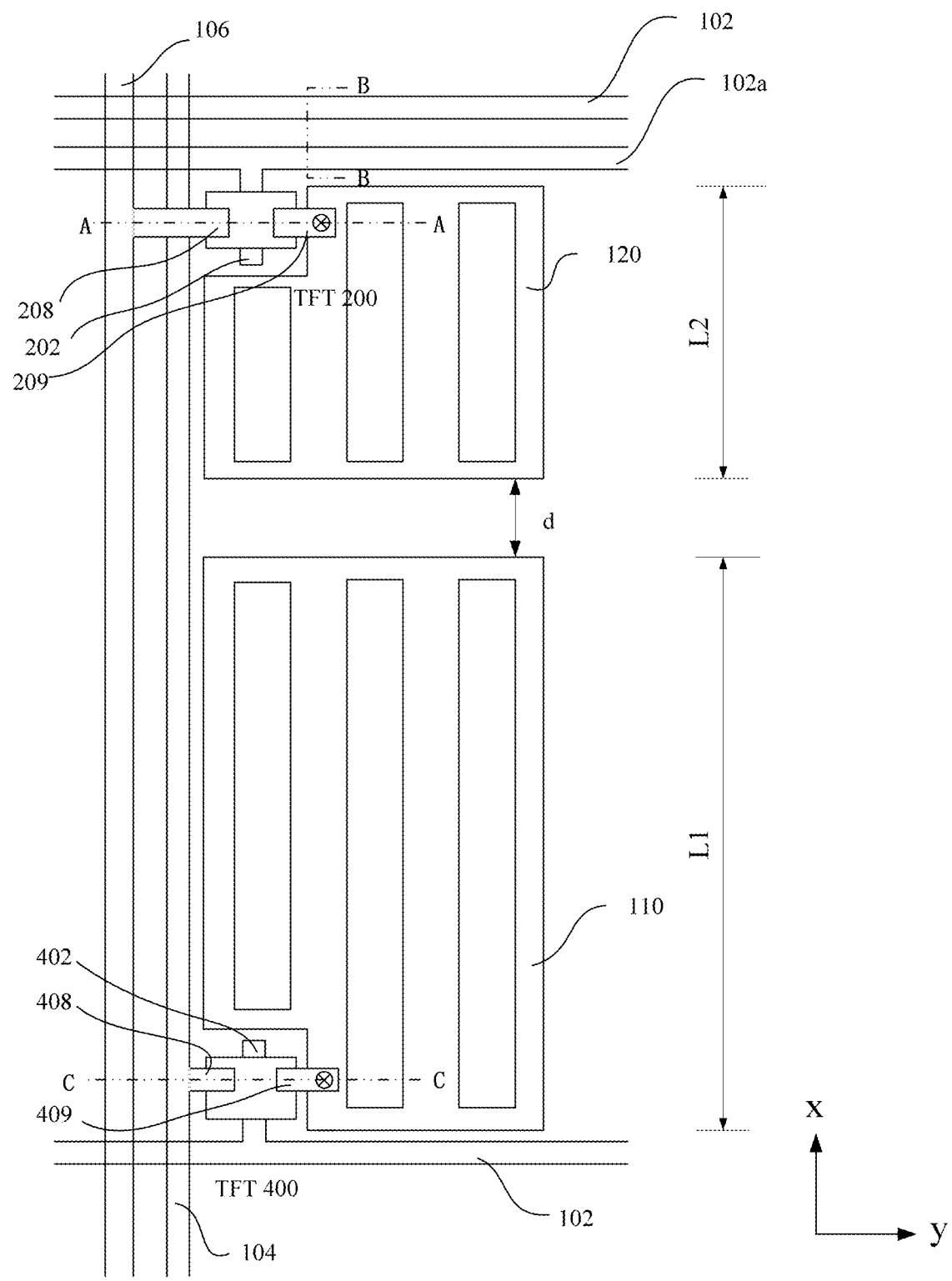
FIG. 2 schematically illustrates an enlarged partial view of a pixel unit of FIG. 1.
Figure 3:
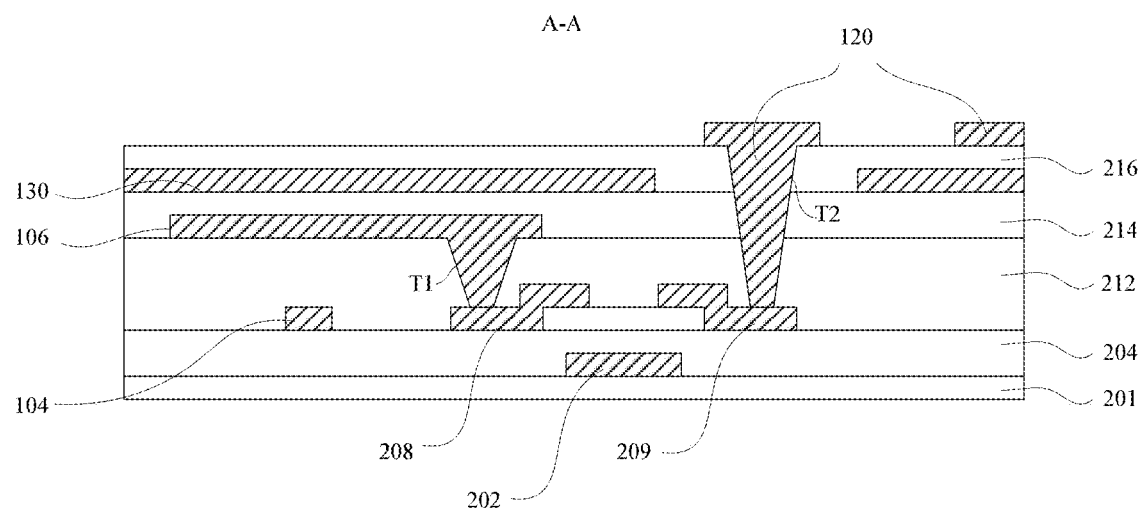
FIG. 3 schematically illustrates a cross-sectional view along A-A line of FIG. 2.
Figure 4A:
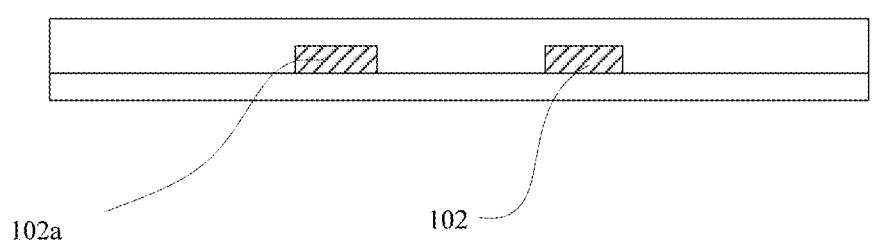
FIG. 4a schematically illustrates a cross-sectional view along B-B line of FIG. 2.
Figure 4B:
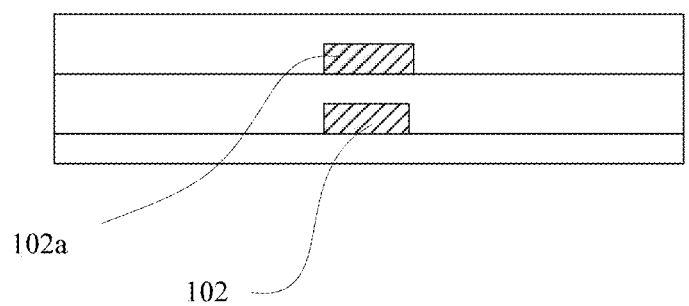
FIG. 4b schematically illustrates locations of two gate lines according to another embodiment of the present disclosure.
Figure 5:
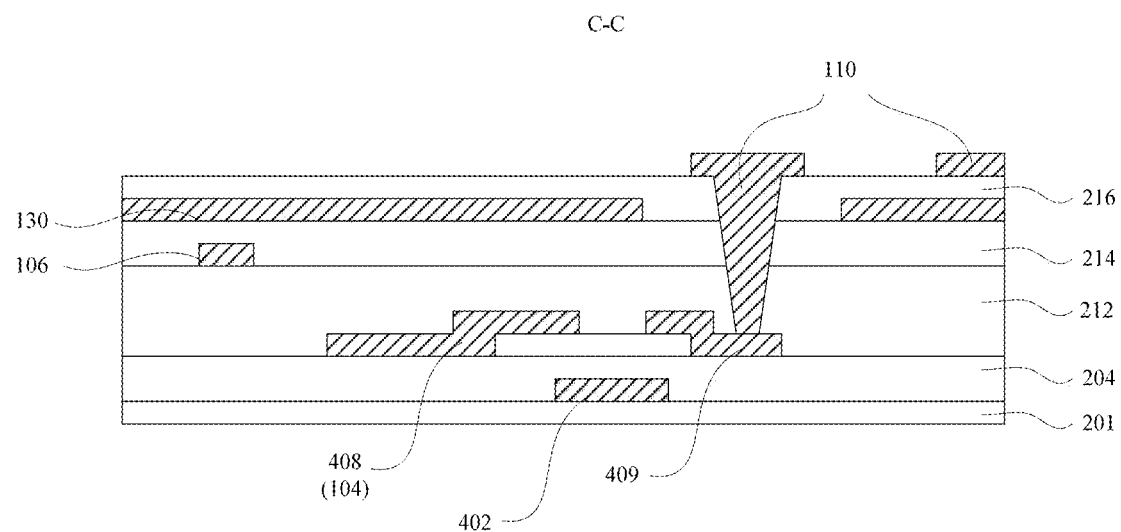
FIG. 5 schematically illustrates a cross-sectional view along C-C line of FIG. 2.

According to still another embodiment of the present disclosure, there is provided a touch display panel. FIG. 1 schematically illustrates a plan view of a touch display panel according to the embodiment of the present disclosure. FIG. 2 schematically illustrates an enlarged partial view of a pixel unit of FIG. 1. FIG. 3 schematically illustrates a cross-sectional view along A-A line of FIG. 2. FIG. 4a schematically illustrates a cross-sectional view along B-B line of FIG. 2. FIG. 4b schematically illustrates locations of two gate lines according to another embodiment of the present disclosure. FIG. 5 schematically illustrates a cross-sectional view along C-C line of FIG. 2.

As illustrated in FIGS. 1 and 2, the touch display panel comprises: a plurality of gate lines 102 and a plurality of data lines 104 intersected each other to define a plurality of pixel units 10; a pixel electrode 110 disposed in each pixel unit 10; a common electrode 130, which is configured to generate an electric field with the pixel electrode 110. The touch display panel further comprises: a touch electrode 120 and a thin film transistor TFT 200 both disposed in each pixel unit 10, the touch electrode 120 is disposed in the same layer as the pixel electrode 110 and insulated from the pixel electrode 110, and the TFT 200 is connected with the touch electrode 120. The touch display panel further comprises a signal line 106 configured to transmit signals to the touch electrode 120.

The touch electrode 120 and the pixel electrode 110 disposed in the same layer are spaced apart from each other, and there is no physical connection and no electrical connection between the two, thus the two are insulated from each other. While the touch signal is transmitted to the touch electrode 120 through the signal line 106, the display signal is transmitted to the pixel electrode 110 simultaneously, therefore, synchronous transmission of the display signal and the touch signal is achieved, not only the charging time of the touch electrode 120 is prolonged, but also the reliability of touch display screen with high resolution and high frequency is increased.

As illustrated in FIGS. 1 and 2, the touch display panel further comprises a plurality of gate lines 102a, each gate line 102a is connected with the gate electrodes 202 of a plurality of TFTs 200 disposed in the same row, and an electrical signal is applied to the plurality of TFTs 200 through the gate line 10. The gate line 102a is substantially parallel to the gate line 102, i.e., both extend in a y direction. In the present embodiment, the gate line 102a is disposed in the same layer as the gate line 102, as illustrated in FIG. 4a. However, in order to increase the aperture ratio, the gate line 102a may not be disposed in the same layer as the gate line 102. For example, as illustrated in 4b, the two gate lines are overlapped with each other in a vertical direction (i.e., a direction perpendicular to a plane of base substrate), that is, orthographic projections of the gate line 102a and the gate line 102 on the plane of the base substrate are overlapped with each other. The gate line 102a is illustrated as a linear shape, however, in other embodiments, the gate lines 102a may be a non-linear shape, such as a curved shape. In present embodiment, the gate line 102a is disposed adjacent to the touch electrode 120, however, the gate line 102a may also be disposed adjacent to the pixel electrode 110. For example, the gate line 102a is disposed in a black matrix region, so as not to affect the aperture ratio.

An end of the gate line 102a is connected with a row driver 20, the row driver 20 is disposed in a peripheral region of the touch display panel, and is configured to control the electrical signal input to the gate line 102a, such as a turn-on voltage (or called high level signal). While the turn-on voltage is greater than a threshold voltage of the TFT 200, the TFT 200 is turned on. In the present embodiment, ends of the plurality of the gate lines 102 are connected with the row driver 20. It can be understood that, the gate lines 102a and the gate lines 102 may be respectively connected with two different drivers to reduce the design difficulty of the driver.

The signal line 102 is substantially parallel to the data line 104, i.e., both extend in an x-direction. For example, as illustrated in FIG. 3, the signal line 106 and the data line 104 are disposed on the same side (such as a left side) of the touch electrode 120, the signal line 106 and the data line 104 are disposed in different layers. In order to increase the aperture ratio, for example, the signal line 106 is overlapped with the data line 104 in the vertical direction (similar to the structure illustrated in FIG. 4b, which is not shown in the drawing), that is, orthographic projections of the signal line 106 and the data line 104 on the plane of the base substrate are overlapped with each other. Alternatively, the signal line 106 and the data line 104 may be respectively disposed on two opposite sides of the touch electrodes 120, for example, the signal line 106 is disposed on a left side of the touch electrode 120, and the data line 104 is disposed on a right side of the touch electrode 120. In this case, the signal line 106 and the data line 104 may be disposed in the same layer. The signal line 106 is illustrated as a linear shape, however, in other embodiments, the signal line 106 may be a non-linear shape, such as a curved shape. Ends of the plurality of data lines 104 are connected with the column driver 30, and the column driver 30 is disposed in the peripheral region of the touch display panel. Ends of the signal lines 106 are connected with a touch sensing circuit 40.

Because the fingerprint of a user's finger is uneven, a capacitance is generated while the finger is in contact with the touch display screen, and value of the capacitance can be sensed through the touch electrode 120. Since the touch electrodes 120 are disposed with high-density on the touch display screen, valleys and ridges of the fingerprint can be sensed, so as to achieve fingerprint recognition. A principle of self-capacitance is used in the fingerprint recognition provided in the present embodiments. First, a touch driving signal is transmitted through the signal line 106; in condition that a finger contacts the touch display screen, a touch sensing signal is generated on each touch electrode 120; secondly, the touch sensing signal is transmitted to the touch sensing circuit 40 through the signal line 106. By detecting the difference between the touch sensing signals of each touch electrode 120 at each moment in a touch process, the fingerprint of the finger can be detected, therefore the fingerprint recognition is realized.

In known technology, the fingerprint recognition and the display scanning are performed in different period of time, for example, the fingerprint recognition is performed in a first period of time, and the display scanning is performed in a second period of time. However, in the touch display panel provided in embodiments of the present disclosure, the fingerprint recognition and the display scanning can be performed simultaneously, not only the charging time of the touch electrode 120 is prolonged, but also the reliability of the touch display screen with high resolution and high frequency is increased.

As illustrated in FIG. 3, the touch display panel comprises: a gate electrode 202, a gate insulation layer 204, an active layer 206, a source electrode 208 and a drain electrode 209, a common electrode 130, a touch electrode 120, a first protective layer 212, a second protective layer 214 and a third protective layer 216, all of which are disposed on a base substrate 201. The gate electrode 202 is connected with a gate line 102a, and a voltage signal supplied from the gate line 102a is input to the gate electrode 202, in case that a value of the voltage signal is higher than a threshold voltage of a TFT 200, the TFT 200 is turned on. The source electrode 208 is connected with a signal line 106 through a contact hole T1 disposed in the first protective layer 212, while the drain electrode 209 is connected with a touch electrode 120 through a contact hole T2 passing through each of the first, second, third protective layer 212, 214, 216. In case that a high level signal is applied to the gate electrode 202 by the gate line 102a, the TFT 200 is turned on, and the touch signal transmitted through the signal line 106 is transmitted to the touch electrode 120 through the source electrode 208 and the drain electrode 209, thus the charging operation of the touch electrode 120 is achieved.

As illustrated in FIG. 2, an area of an orthographical projection of the touch electrode 120 in the plane of the base substrate 201 is smaller than an area of an orthographical projection of the pixel electrode 110 on the plane of the base substrate 201, that is, the touch area is smaller than the display area. For example, in the x-direction, a length L2 of the touch electrode 120 is less than a length L1 of the pixel electrode 110; in the y-direction, a width of the pixel electrode 110 is equal to a width of the touch electrode 120, herein, the x-direction and the y-direction are perpendicular to each other.

Figure 6:
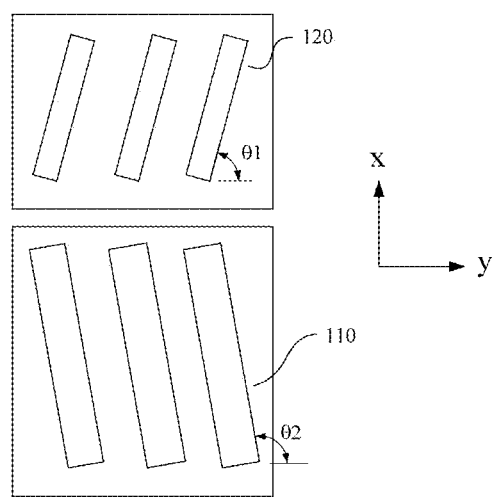
FIG. 6 schematically illustrates a touch electrode and a pixel electrode according to another embodiment of the present disclosure.

In the present embodiment, a pattern of the touch electrode 120 and a pattern of the pixel electrode 110 are the same, for example, the touch electrode 120 and the pixel electrode 110 are in a stripe shape. In other embodiments, patterns of the touch electrode 120 and the pixel electrode 110 are different from each other. For example, the touch electrode 120 is in a flat shape, and the pixel electrode 110 is in a stripe shape, and vice versa. In the present embodiment, a slit width of the touch electrode 120 is same as that of the pixel electrode 110, and the slits of both two electrodes extend in x-direction. However, in other embodiments, the slit width, length and the extending direction of the touch electrode 120 may be different from those of the pixel electrode 110. For example, as illustrated in FIG. 6, the slit width of the touch electrode 120 is smaller than the slit width of the pixel electrode 110, and the slits of the touch electrode and the pixel electrode are extended in different directions. The slit of the touch electrode 120 is inclined, and there is an angle θ1 between its extending direction and y-direction; the slit of the pixel electrode 110 is inclined, and there is an angle θ2 between its extending direction and y-direction, for example, the angle θ1 is less than the angle θ2. It can be understood that, those skilled in the art can make various changes and combinations of the patterns, sizes and extending directions of slits of the touch electrode 120 and the pixel electrode 110, which will not be described herein.

A gap between the touch electrode 120 and the pixel electrode 110 is set such that mutual interference can be avoided. For example, as illustrated in FIG. 2, the distance d from a lower edge of the touch electrode 120 to an upper edge of the pixel electrode 110 is ranged from 1 micrometers to 5 micrometers.

In at least some of the embodiments, the touch electrode 120 is made of an electrically conductive material, such as a transparent electrically conductive material. Thus, after the touch detection, the display signal may be input to the touch electrode 120, at this moment, the touch electrode 120 serves as the pixel electrode 110. As an example, the touch electrode 120 and the pixel electrode 110 are made of the same material, for example, a transparent electrically conductive material, such as ITO, IZO, etc. The touch electrode 120 and the pixel electrode 110 may be formed simultaneously by a patterning process. The patterning process includes but is not limited to, a screen printing process, a spray coating process, a 3D printing technology, and a photolithographic process. For example, the photolithographic process comprises the following steps: coating a photoresist, exposing with a mask, developing, etching and peeling off remaining photoresist, to finally obtain a desired electrode pattern.

In at least some of the embodiments, both the signal line 106 and the gate line 102a are made of an electrically conductive material, such as a metal, and examples of the metal comprises, but are not limited to, Mo, Al, Cu, and alloys thereof.

In the present embodiments, only two common electrodes 130 are illustrated in FIG. 1, each common electrode 130 is shared by nine pixel electrodes 110, and the common electrode 130 is configured to generate an electric field with each pixel electrode 110. It can be understood that, the common electrode 130 may be disposed to correspond to any number of pixel electrodes 110, for example, one pixel electrode, or two pixel electrodes. In the present embodiment, the common electrode 130 is in a flat shape, and the pixel electrode 110 is in a stripe shape. In other embodiments, the pixel electrode 110 may be in a flat shape, and the common electrode may be in a stripe shape. In addition, although the common electrode 130 is disposed below the pixel electrode 110 as illustrated in FIG. 5, it can be understood that, the positions of the common electrode 130 and the pixel electrode 110 may be interchanged. That is, the common electrode 130 is disposed above the pixel electrode 110, an electric field can also be generated between the two electrodes.

In at least some of the embodiments, the touch display panel further comprises a TFT 400 configured to turn on or turn off the pixel electrode 110. As illustrated in FIG. 2 and FIG. 5, the TFT 400 comprises a gate electrode 402, a source electrode 408 and a drain electrode 409. The gate electrode 402 is connected with the gate line 102, the source electrode 408 is connected with the data line 104, and the drain electrode 409 is connected with the pixel electrode 110. The signal line 106 is disposed on different layer from the data line 104. In case that a high level signal is applied to the gate electrode 402 by the gate line 102 (i.e., a signal is higher than a threshold of TFT 400), the TFT 400 is turned on, and the display signal transmitted through the data line 104 is transmitted to the pixel electrode 110 through the source electrode 408 and the drain electrode 409.

While the display signal is transmitted to the pixel electrode 110 through the data line, the touch signal is transmitted to the touch electrode 120 through the dedicated signal line 106, so the normal display of the pixel electrode 110 is not disturbed. According to the present embodiment, the synchronous transmission of the display signal and the touch signal is achieved, not only the charging time is prolonged, but also the power consumption is reduced, and the reliability of the touch display screen with high resolution and high frequency is increased.

Figure 7:
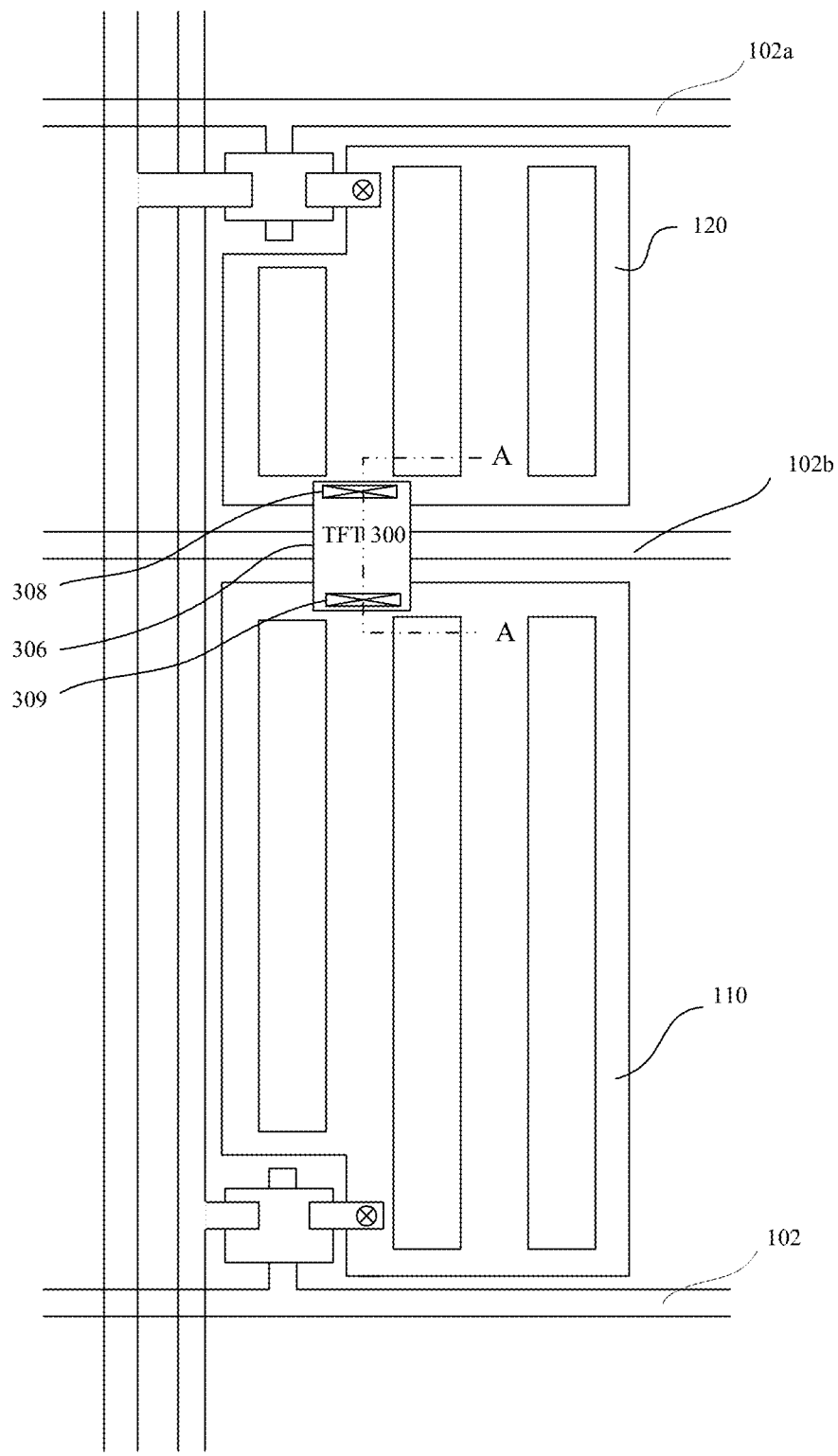
FIG. 7 schematically illustrates a plan view of a touch display panel according to another embodiment of the present disclosure.
Figure 8:
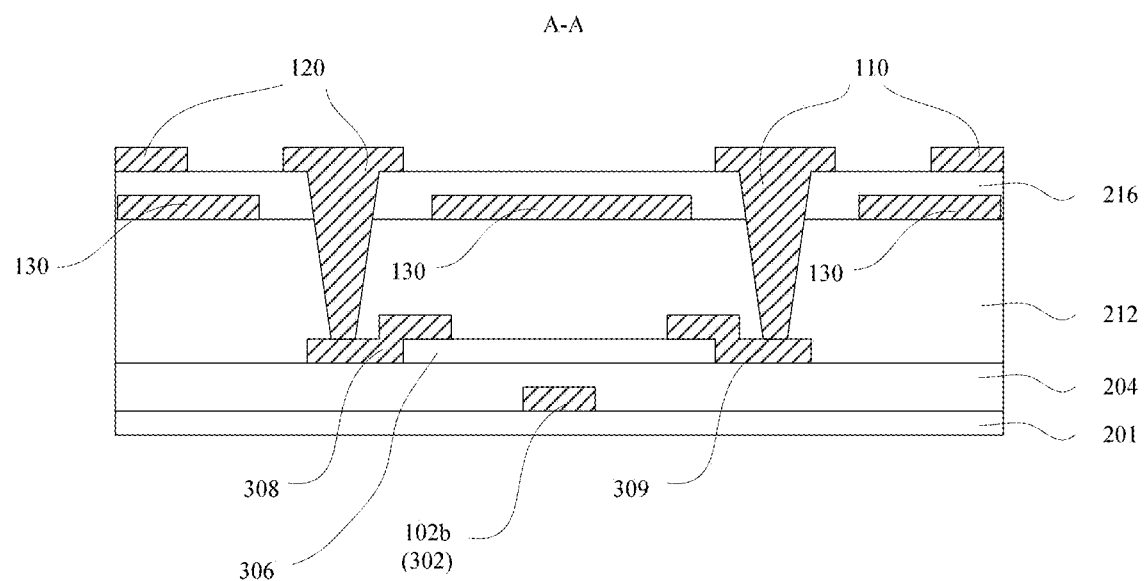
FIG. 8 schematically illustrates a cross-sectional view along A-A line of FIG. 7.

According to still another embodiment of the present disclosure, there is provided a touch display panel. FIG. 7 schematically illustrates a plan view of a touch display panel according to another embodiment of the present disclosure. FIG. 8 schematically illustrates a cross-sectional view along A-A line of FIG. 7.

The present embodiment differs from the embodiment illustrated in FIG. 1 in that, the touch display panel further comprises a TFT 300 disposed in each pixel unit. The TFT 300 comprises a gate electrode 302, a source electrode 308 and a drain electrode 309; the source electrode 308 is connected with the touch electrode 120, and the drain electrode 309 is connected with the pixel electrode 110. For example, the touch electrode 120 is connected with the source electrode 308 through a contact hole, and the pixel electrode 110 is connected with the drain electrode 309 through another contact hole.

The touch display screen further comprises a gate line 102b disposed in a gap between the touch electrode 120 and the pixel electrode 110. The gate line 102b is connected with the gate electrode 302. The gate line 102b is substantially parallel to the gate line 102, for example, both the two gate lines extends in the y-direction. The gate line 102b is illustrated in a linear shape, however, in other embodiments, the gate line 102b may be in a non-linear shape, such as a curved shape. In order to reduce the influence on the display effect, the gate line 102b may be made of a non-opaque material, such as a transparent electrically conductive material. For ease of manufacturing, the gate line 102b may serves as the gate electrode 302, and it is not needed to be separately manufactured.

As illustrated in FIG. 7, the TFT 300 is disposed on a side of the pixel unit close to the data line 104 (a left side of the pixel unit). It can be understood that, the position of the TFT 300 can be changed, it can also be disposed on a right side or middle of the pixel unit. As an example, a width of the active layer 306 in y-direction is equal to a width of the pixel electrode 110 in y-direction, or a width of the active layer 306 in y-direction is equal to a width of the touch electrode 120 in y-direction.

In case that a voltage applied to the TFT 300 by the gate line 102b is higher than a threshold of TFT 300, the TFT 300 is turned on, and the source electrode 308 and the drain electrode 309 are conducted to each other, so that the touch electrode 120 and the pixel electrode 110 are electrically connected with each other. If the voltage of the touch electrode 120 is higher than the voltage of the pixel electrode 110, the voltage of the touch electrode 120 will decreased, and the voltage of the pixel electrode 110 will be increased, and finally the voltages of the two is reached to an average, therefore, the display function of the touch electrode 120 and the pixel electrode 110 are performed together. In other words, if the voltage of the pixel electrode 110 is insufficient to display, the touch electrode 120 has a compensation function where voltage compensation can be provided to the pixel electrode 110.

According to an embodiment of the present disclosure, there is provided a method for driving a touch display panel in at least some of the embodiments, which comprises:

transmitting a touch signal to a touch electrode 120, at the same time of transmitting a display signal to a pixel electrode 110, the signals transmitted to the touch electrode 120 and the pixel electrode 110 respectively are transmitted through different lines. For example, the display signal is transmitted to the pixel electrode 110 through a data line 104, and the touch signal is transmitted to the touch electrode 120 through a signal line 106. For example, the touch signal is a pulse voltage, and the display signal is a driving voltage, such as high or low-level voltage.

In at least some of the embodiments, transmitting the touch signal to the touch electrode comprises: inputting a touch driving signal for fingerprint recognition to the touch electrode through the signal line. In at least some of the embodiments, after inputting the touch driving signal to the touch electrode, the method further comprises: outputting a touch sensing signal from the touch electrode through the signal line. The specific process of fingerprint recognition may refer to the description in the embodiment illustrated in FIG. 1, which will not be repeated herein.

Figure 9:
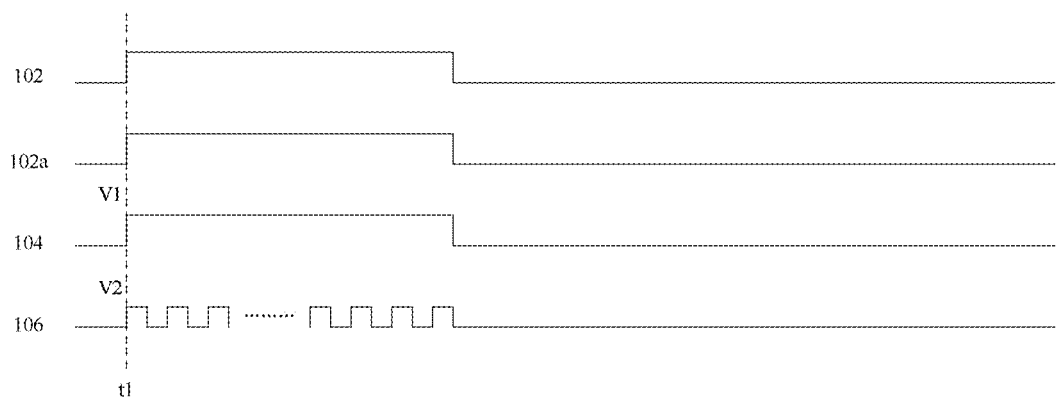
FIG. 9 schematically illustrates a timing of each control signal according to an embodiment of the present disclosure.

FIG. 9 schematically illustrates a timing of each control signal according to an embodiment of the present disclosure. While the high level signal is input to the gate line 102, the driving voltage V1 is input to the pixel electrode 110 through the data line 104 simultaneously. Meanwhile, while the high level signal is input to the gate line 102a, the pulse voltage V2 is input to the touch electrode 120 through the signal line 106. It can be seen in the figure, starting from time t1, the driving voltage V1 and the pulse voltage V2 are respectively input to the pixel electrode 110 and the touch electrode 120, therefore, synchronous transmission of the display signal and the touch signal is realized, and then the display scanning and the touch detection are realized simultaneously.

Figure 10:
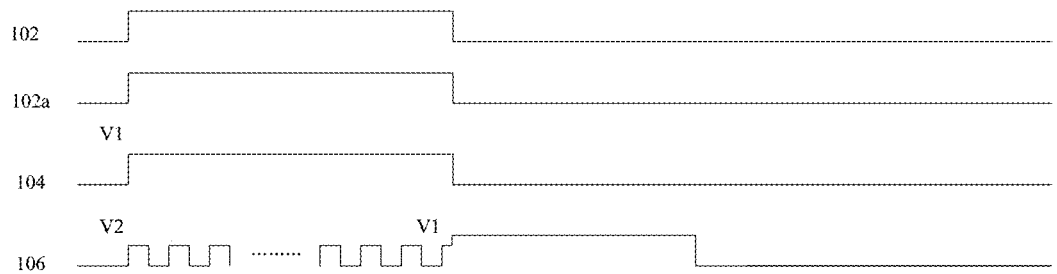
FIG. 10 schematically illustrates a timing of each control signal according to another embodiment of the present disclosure.

In at least some of the embodiments, after the completion of transmitting the touch signal to the touch electrode 120, the method further comprises: adjusting the touch signal to be greater than or equal to the driving voltage. FIG. 10 schematically illustrates a timing of each control signal according to another embodiment of the present disclosure. As illustrated in FIG. 10, after the completion of inputting the pulse voltage V2 to the touch electrode 120, the pulse voltage transmitted through the signal line 106 is adjusted to be the voltage V1, at this moment, the touch electrode 120 and the pixel electrode 110 achieves the display function together.

In at least some of the embodiments, after the completion of transmitting the touch signal to the touch electrode 120, the method further comprises: adjusting the pulse voltage to be greater than or equal to the driving voltage, and electrically connecting the pixel electrode to the touch electrode.

Figure 11:
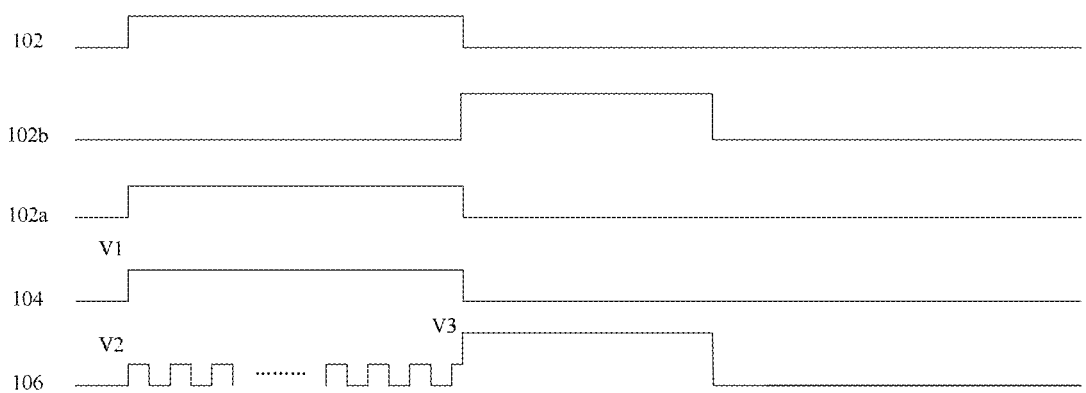
FIG. 11 schematically illustrates a timing of each control signal according to still another embodiment of the present disclosure.

FIG. 11 schematically illustrates a timing of each control signal according to still another embodiment of the present disclosure. As illustrated in FIG. 11, after the completion of transmitting the pulse voltage V2 to the touch electrode 120, the pulse voltage V2 is adjusted to be a voltage V3 which is greater than the driving voltage V1, and a high level signal is output to the gate line 102b, so that the touch electrode 120 and the pixel electrode 110 is electrically connected with each other. In case that the voltage applied on the pixel electrode 110 is insufficient, a voltage compensation is provided for the pixel electrode 110 by the touch electrode 120, because the voltage V3 is greater than the driving voltage V1. By using the driving method of the present embodiment, the reliability of the display screen such as LTPS is further increased, and the display effect of the display screen is increased.

Figure 12:
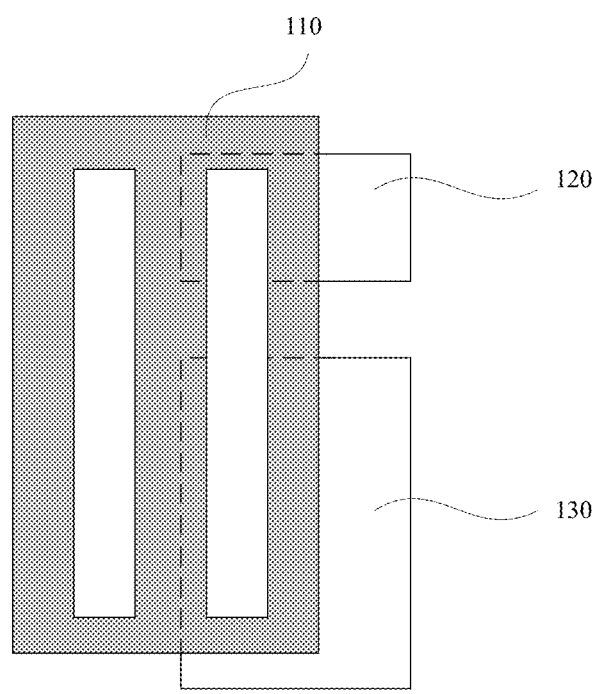
FIG. 12 schematically illustrates a simplified plan view of pixel unit of a touch display panel according to still another embodiment of the present disclosure.

According to still another embodiment, there is provided a touch display panel. FIG. 12 schematically illustrates a simplified plan view of pixel unit of the touch display panel according to still another embodiment of the present disclosure.

The present embodiment differs from the embodiment illustrated in FIG. 1 in that: each pixel unit 10 is provide with a common electrode 130, the touch electrode 120 and the common electrode 130 are disposed in the same layer and insulated from each other; the touch electrode 120 and the common electrode 130 are both in a flat shape. A gap is formed between the touch electrode 120 and the common electrode 130.

It can be understood that, in the present embodiment, the positional relationship, the size and the structure of the common electrode 130 and the touch electrode 120 are similar to those described in the embodiment illustrated in FIG. 1, so it is not repeated herein.

Since the pixel electrode 110 and the touch electrode 120 are disposed in different layers, they may be overlapped with each other in the vertical direction, and the area of the pixel electrode 110 may not be reduced, the aperture ratio of the touch display panel is not affected. The touch electrode 120 and the common electrode may be formed by the same patterning process.

Similar to the embodiment illustrated in FIG. 1, the touch display panel provided in the present embodiment further comprises: a TFT 200 configured to turn on or turn off the touch electrode 120, a gate line 102a and a signal line 106. For detailed description, it can be referred to the previous embodiment. It can be understood that, in the case of learning the concept of the present disclosure, those skilled in the art can suitably change or design structures such as TFT 200, TFT 400, the signal line 106, the data line 104 the gate lines 102, 102a and 102b, according to the different layers on which the touch electrode is disposed.

In the present disclosure, the following points needs to explain:

(1) The accompanying drawings involve only the structure(s) in connection with the embodiment(s) of the present disclosure, and other structure(s) can be referred to common design(s).

(2) For the purpose of clarity only, in accompanying drawings for illustrating the embodiment(s) of the present disclosure, the thickness and a size of a layer or area may be enlarged or narrowed, that is, the drawings are not drawn in a real scale.

(3) In case of no conflict, features in one embodiment or in different embodiments can be combined as a new embodiment.

What is described above is related to the illustrative embodiments of the disclosure only and not limitative to the scope of the disclosure; the scopes of the disclosure are defined by the accompanying claims.

The invention claimed is:

1. A touch display unit, comprising:
a first electrode and a second electrode;
a touch electrode, disposed in a same layer as one of the first electrode and the second electrode and insulated from each other;
a signal line, configured to transmit a signal to the touch electrode;
a first thin film transistor, through which the signal is transmitted from the signal line to the touch electrode, the first thin film transistor comprising: a first gate electrode, a first source electrode and a first drain electrode; and
a second thin film transistor, disposed in the at least one of the plurality of pixel units, the second thin film transistor comprising: a second gate electrode, a second source electrode and a second drain electrode, the second source electrode being connected with the touch electrode, and the second drain electrode being connected with the first electrode.

2. A touch display panel, comprising:
a plurality of gate lines and a plurality of data lines, intersected each other to define a plurality of pixel units;
a first electrode and a second electrode, both disposed in each pixel unit;
a touch electrode, located in at least one of the plurality of pixel units, disposed in a same layer as one of the first electrode and the second electrode and insulated from each other;
a signal line, configured to transmit a signal to the touch electrode;
a first thin film transistor, through which the signal is transmitted from the signal line to the touch electrode, the first thin film transistor comprising: a first gate electrode, a first source electrode and a first drain electrode; and
a second thin film transistor, disposed in the at least one of the plurality of pixel units, the second thin film transistor comprising: a second gate electrode, a second source electrode and a second drain electrode, the second source electrode being connected with the touch electrode, and the second drain electrode being connected with the first electrode.

3. The touch display panel according to claim 2, further comprising: a first gate line, wherein the first gate line is connected with the first thin film transistor.

4. The touch display panel according to claim 3, wherein the first gate electrode is connected with the first gate line, the first source electrode is connected with the signal line, and the first drain electrode is connected with the touch electrode.

5. The touch display panel according to claim 3, further comprising: a base substrate, wherein, the first gate line is substantially parallel to each gate line, the first gate line and the gate line are disposed in different layers, and orthographic projections of the first gate line and the gate line on a plane of the base substrate are overlapped.

6. The touch display panel according to claim 2, wherein the touch electrode is disposed in a same layer as the first electrode, and a gap is formed between the touch electrode and the first electrode.

7. The touch display panel according to claim 6, further comprising: a second gate line, wherein the second gate line is connected with the second gate electrode, the second gate line is substantially parallel to each gate line, and is disposed in the gap between the touch electrode and the first electrode.

8. The touch display panel according to claim 6, further comprising: a base substrate, wherein an area of an orthographical projection of the touch electrode on a plane of the base substrate is smaller than an area of an orthographical projection of the first electrode on the plane of the base substrate.

9. The touch display panel according to claim 2, further comprising: a base substrate, wherein the touch electrode and the second electrode are disposed in a same layer, and orthographic projections of the first electrode and the touch electrode on a plane of the base substrate are overlapped with each other.

10. The touch display panel according to claim 2, further comprising: a base substrate, wherein the signal line is substantially parallel to each data line, the signal line and the data line are disposed in different layers, and orthographic projections of the signal line and the data line on a plane of the base substrate are overlapped with each other.

11. A method for driving the touch display panel according to claim 2, comprising:
transmitting a touch signal to a touch electrode at same time of transmitting a display signal to a first electrode, wherein signals transmitted to the touch electrode and the first electrode are respectively transmitted through different lines.

12. The method for driving the touch display panel according to claim 11, wherein the touch signal is transmitted to the touch electrode through a signal line, and the display signal is transmitted to the first electrode through a data line.

13. The method for driving the touch display panel according to claim 11, wherein after completion of transmitting the touch signal to the touch electrode, the method further comprises: adjusting the touch signal to be the display signal.

14. The method for driving the touch display panel according to claim 11, wherein after completion of transmitting the touch signal to the touch electrode, the method further comprises: adjusting a voltage of the touch signal to be greater than or equal to a voltage of the display signal.

15. The method for driving the touch display panel according to claim 14, wherein the method further comprises: electrically connecting the first electrode and the touch electrode at same time of adjusting the voltage of the touch signal to be greater than or equal to the voltage of the display signal.

16. The method for driving the touch display panel according to claim 11, wherein the transmitting the touch signal to the touch electrode comprises:
inputting a touch driving signal for fingerprint recognition to the touch electrode through the signal line.

17. The method for driving the touch display panel according to claim 16, wherein after inputting the touch driving signal to the touch electrode, the method further comprises: outputting a touch sensing signal from the touch electrode through the signal line.

* * * * *